(12) United States Patent
Subramanian

(10) Patent No.: US 6,374,149 B1
(45) Date of Patent: *Apr. 16, 2002

(54) SYSTEM AND METHOD FOR DETERMINING THE CENTER OF A WAFER ON A WAFER TABLE

(75) Inventor: Balamurugan Subramanian, Plano, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/080,902

(22) Filed: May 18, 1998

(51) Int. Cl.⁷ .............................................. G06F 19/00
(52) U.S. Cl. ...................................... 700/121; 414/936
(58) Field of Search ............................. 414/936; 700/59, 700/121; 382/145; 348/87

(56) References Cited

U.S. PATENT DOCUMENTS

| | | | | |
|---|---|---|---|---|
| 4,301,470 A | * | 11/1981 | Pagany ........................ 348/95 |
| 4,752,898 A | * | 6/1988 | Koenig ........................ 356/400 |
| 4,819,167 A | * | 4/1989 | Cheng et al. .................. 700/59 |
| 4,914,601 A | * | 4/1990 | Smyth, Jr. .................... 716/19 |
| 5,362,681 A | * | 11/1994 | Roberts, Jr. et al. ........ 438/464 |
| 5,513,948 A | * | 5/1996 | Bacchi et al. ................ 414/783 |
| 5,696,835 A | * | 12/1997 | Hennessey et al. ......... 382/141 |
| 5,706,201 A | * | 1/1998 | Andrews ..................... 700/108 |
| 5,822,213 A | * | 10/1998 | Huynh ........................ 700/213 |
| 5,825,913 A | * | 10/1998 | Rostami et al. ............. 382/151 |
| 5,870,488 A | * | 2/1999 | Rush et al. .................. 382/151 |
| 5,915,231 A | * | 6/1999 | Beffa .......................... 702/118 |
| 5,933,351 A | * | 8/1999 | Balamurugan .............. 700/121 |
| 5,946,408 A | * | 8/1999 | Honda ........................ 382/149 |
| 5,946,409 A | * | 8/1999 | Hori ............................ 382/149 |
| 6,028,664 A | * | 2/2000 | Cheng et al. ............. 356/237.4 |

* cited by examiner

*Primary Examiner*—William Grant
*Assistant Examiner*—Edward F. Gain, Jr.
(74) *Attorney, Agent, or Firm*—Wade James Brady III; Frederick J. Telecky Jr.

(57) ABSTRACT

A method for determining the center (62) of a silicon wafer (54) on a wafer table (14) is provided. The method includes measuring silicon wafer data with a sensor (22). The silicon wafer data is received at a wafer center computing system (38). The coordinates of the wafer center (Xw,Yw) in a wafer table Cartesian coordinate system (72) are computed. The coordinates of the edge of the silicon wafer (54) are then determined from the wafer center coordinates (Xw,Yw).

10 Claims, 3 Drawing Sheets

SYSTEM AND METHOD FOR DETERMINING THE CENTER OF A WAFER ON A WAFER TABLE

TECHNICAL FIELD OF THE INVENTION

This invention relates to semiconductor circuit manufacturing and more particularly to a system and method for determining a center of a wafer on a wafer table.

BACKGROUND OF THE INVENTION

Semiconductor manufacturing includes the process of moving semiconductor substrate dies from a wafer table to a lead frame after they have been cut from a silicon wafer of substrate material. A silicon wafer is first placed on an adhesive surface and is cut into rectangular dies. After cutting, the adhesive surface is placed on a wafer table of a die bonder apparatus. The die bonder deposits an adhesive on the lead frame, removes a cut die from the adhesive surface, and places it on the lead frame. The silicon wafer from which the dies are cut is round, such that there will be some dies that are not fully rectangular. These non-rectangular dies will be left on the adhesive surface and discarded.

If the process of removing dies from a silicon wafer is automated, the position of the silicon wafer and dies must be known or estimated, in order to allow a robot arm to manipulate the wafer and dies. Nevertheless, the position of the silicon wafer may randomly change with respect to the known coordinates of the adhesive surface during the die cutting operation. When such random changes occur, no die may be present at some locations in which a die is expected. This condition may result in unnecessary wafer table movements.

To prevent this condition from occurring, known methods of automating the removal of cut dies of a silicon wafer from the adhesive surface typically include conservative assumptions about the location of the wafer on the adhesive surface. These assumptions may result in a loss of usable cut dies, or the performance of additional wafer table movements that increase the amount of time needed to remove the cut dies.

SUMMARY OF THE INVENTION

Therefore, it is a general object of the present invention to provide a system and method for finding the center of a silicon wafer on a wafer table that substantially eliminates or reduces the problems associated with removing cut dies from a wafer table that result from uncertainty of the wafer's location.

In particular, a system and method for finding the center of a silicon wafer on a wafer table is described that may be used to precisely locate the wafer, to prevent unnecessary wafer table movements during the die removal process, and to minimize or prevent waste of usable cut dies.

According to one embodiment of the present invention, a method for determining the center of a silicon wafer on a wafer table is provided. The method includes receiving silicon wafer data from a sensor. The silicon wafer data is received at a wafer center computing system. The coordinates of the wafer center (Xw,Yw) in a wafer table Cartesian coordinate system are computed. The location of the silicon wafer edge is then determined from the wafer center coordinates (Xw,Yw) and the known silicon wafer diameter.

One important technical advantage of the present invention is that the center of a silicon wafer on a wafer table may be precisely located. The position of the silicon wafer edge on the wafer table can then also be precisely located with respect to the center of the silicon wafer.

Another important technical advantage of the present invention is that die removal methods may be implemented that minimize the number of usable cut dies that may be lost during the die removal process.

BRIEF DESCRIPTION OF THE DRAWINGS

For a more complete understanding of the present invention and advantages thereof, reference is now made to the following description taken in conjunction with the accompanying drawings, in which like reference numbers indicate like features and wherein.

DETAILED DESCRIPTION OF THE INVENTION

Preferred embodiments of the present invention are illustrated in the FIGURES, like numerals being used to refer to like and corresponding parts of the various drawings.

Figure 1:
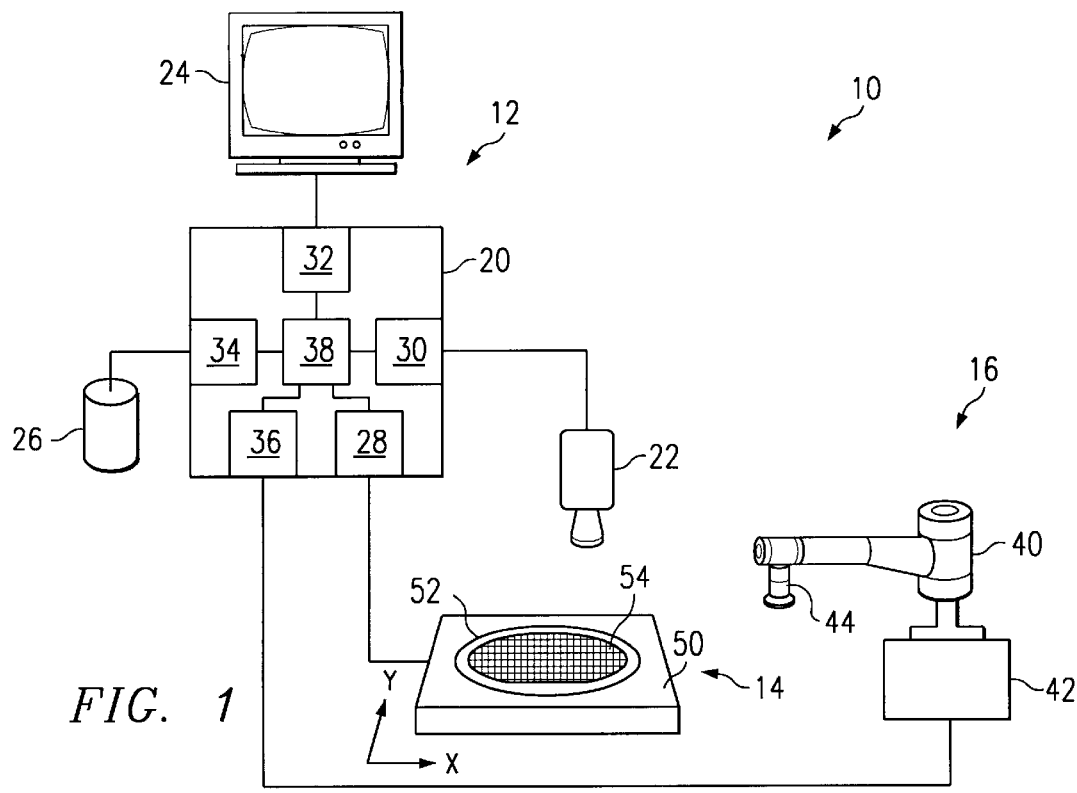
FIG. 1 is a diagram of a system for finding the center of a silicon wafer on a wafer table according to one embodiment of the present invention.

FIG. 1 is a diagram of a system 10 for finding the center of a silicon wafer on a wafer table according to one embodiment of the present invention. System 10 may be an Abacus IIID-SETTLEMENT AGREEMENT Die Bonder of Texas Instruments Incorporated. System 10 includes a data processing system 12, a wafer table system 14, and a robot assembly 16. Data processing system 12 is coupled to wafer table system 14 and robot assembly 16 and provides silicon wafer data to robot assembly 16 to remove dies cut from a silicon wafer 54 on wafer table 50.

Data processing system 12 includes a central processing system 20, which is coupled to a video camera 22, a display 24, a data storage system 26, wafer table system 14, and robot assembly 16. In order to interface with the peripheral components described, central processing system 20 uses, respectively, a video interface system 30, a display interface system 32, a data storage interface system 34, a wafer table interface system 28, and a robot assembly interface system 36. Central processing system 20 also comprises wafer center computing system 38.

Wafer center computing system 38 comprises suitable hardware, operating system software, and software applications that operate on central processing system 20.

Wafer center computing system 38 is coupled to wafer table interface system 28, video interface system 30, display interface system 32, data storage interface system 34, and robot assembly interface system 36. Wafer center computing system 38 receives analog or digital data from video camera 22 and data storage system 26 through video interface system 30 and data storage interface system 34, respectively. Wafer center computing system 38 processes the digital and analog data received from video camera 22 and data storage system 26, and transmits data comprising the coordinates of the center of silicon wafer 54 to a wafer table 50 of wafer table system 14.

Video camera 22 comprises a charge coupled device (CCD) such as a solid state camera which converts a visual image into analog or digital data. Video camera 22 may alternately comprise many suitable silicon wafer data sensors that can generate data that defines the location of silicon wafer 54 on wafer table 50. Video camera 22 is focused on wafer table 50 and generates analog or digital data that may be used by display interface system 32 to generate an image of silicon wafer 54 on wafer table 50. Video camera 22 is coupled to video interface system 30.

Display 24 is a visual interface that is used to present visual images for viewing by a user. Display 24 may comprise a monitor using a cathode ray tube, a liquid crystal diode, or other suitable visual interface devices. Display 24 is coupled to display interface system 32 operating on central processing system 20, which supplies image data to display 24 from other systems. Display 24 can present textual and graphical images to a user, such as a warning message or an image generated from data received from video camera 22.

Data storage system 26 comprises a data memory device such as a random access memory (RAM), a magnetic media hard drive, a magnetic tape drive, or other suitable data memory devices. Data storage system 26 is coupled to data storage interface system 34 and can store and retrieve digitally-encoded data in response to operating system commands.

Wafer table interface system 28 comprises suitable hardware, operating system software, and software applications that operate on central processing system 20. Wafer table interface system 28 is coupled to wafer center computing system 38 and wafer table 50. Wafer table interface system 28 transmits data to wafer table 50 that defines the location of the center of silicon wafer 54 in a Cartesian coordinate system of wafer table 50.

Video interface system 30 comprises suitable hardware, operating system software, and software applications that operate on central processing system 20. Video interface system 30 is coupled to wafer center computing system 38 and video camera 22. Video interface system 30 receives data from video camera 22 and transmits the data to wafer center computing system 38. Video interface system 30 may include image recognition programs that process the data from video camera 22 and identify dies cut from silicon wafer 54, predetermined edge points of silicon wafer 54, or other images.

Display interface system 32 comprises suitable hardware, operating system software, and software applications that operate on central processing system 20. Display interface system 32 is coupled to wafer center computing system 38 and display 24. Display interface system 32 receives data from wafer center computing system 38 and other systems and transmits the data to display 24.

Data storage interface system 34 comprises suitable hardware, operating system software, and software applications that operate on central processing system. 20. Data storage interface system 34 is coupled to data storage system 26 and wafer center computing system 38. Data storage interface system 34 transfers data between water center computing system 38 and other systems and components, and stores the data on data storage system 26.

Robot assembly 16 includes robot arm 40 and robot controller 42. Robot assembly 16 may be, for example, a robot assembly of an Abacus IIID-SETTLEMENT AGREEMENT Die Bonder of Texas Instruments Incorporated. Robot arm 40 is a controllable electromechanical device that may be moved in three dimensions, and which has a controllable suction device 44. Robot controller 42 is coupled to robot arm 40 and robot assembly interface system 36.

Robot controller 42 is a programmable controller that controls the movement of robot arm 40 such that suction device 44 may be placed at a die removal position. This die removal position is a fixed position. Robot controller 42 may cause the die to be held by suction device 44 while robot arm 40 moves the die to an appropriate location, such as a lead frame (not explicitly shown). Robot controller 42 typically causes suction device 44 to be placed at the same location relative to wafer table 50, such that the placement of dies for removal by suction device 44 is accomplished by moving wafer table 50 in the "X" and "Y" directions shown in FIG. 1.

Wafer table system 14 may be a wafer table system of an Abacus IIID-SETTLEMENT AGREEMENT Die Bonder of Texas Instruments Incorporated. Wafer table system 14 includes wafer table 50, adhesive surface 52, and silicon wafer 54. Wafer table 50 comprises a programmable controller that receives the wafer center coordinates from wafer center computing system 38 and then calculates the continuous wafer edge coordinates from the wafer center coordinates. Wafer table 50 also comprises suitable motive elements and is operable to move in an "X" direction and a "Y" direction, as shown in FIG. 1, in response to control signals received from wafer table interface system 28. Wafer table 50 moves relative to the fixed die removal position, such that the die removal position may be controllably located at any coordinate location of wafer table 50. Adhesive surface 52 comprises an adhesive material that is used to hold silicon wafer 54. As previously noted, silicon wafer 54 moves relative to adhesive surface 52 during cutting operations.

In operation, wafer center computing system 38 receives digital or analog data from video camera 22 through video interface system 30. Wafer center computing system 38 processes the data generated by video camera 22 to determine the coordinates of predetermined points along the edge of silicon wafer 54 within a Cartesian coordinate system of wafer table 50, such as by processing the data with an image recognition program. Wafer center computing system 38 then uses these coordinates to compute the coordinates of the center of silicon wafer 54 within the Cartesian coordinate system of wafer table 50.

Wafer center computing system 38 then transmits the center coordinates of silicon wafer 54 to wafer table system 14. The programmable controller of wafer table 50 uses the center coordinates of silicon wafer 54 to precisely control the position the individual dies of silicon wafer 54 relative to the typically fixed die retrieval position of suction device 44 of robot arm 40. Wafer table 50 is further operable to prevent the placement of the die removal position beyond the continuous edge coordinates of silicon wafer 54 that are calculated from the wafer center coordinates.

One of ordinary skill in the art will recognize that wafer center computing system 38 may comprise other components and features without departing from the spirit and scope of the present invention. For example, wafer center computing system 38 may use a sensor other than video camera 22 to determine the coordinates corresponding to predetermined points along the edge of silicon wafer 54.

Figure 2:
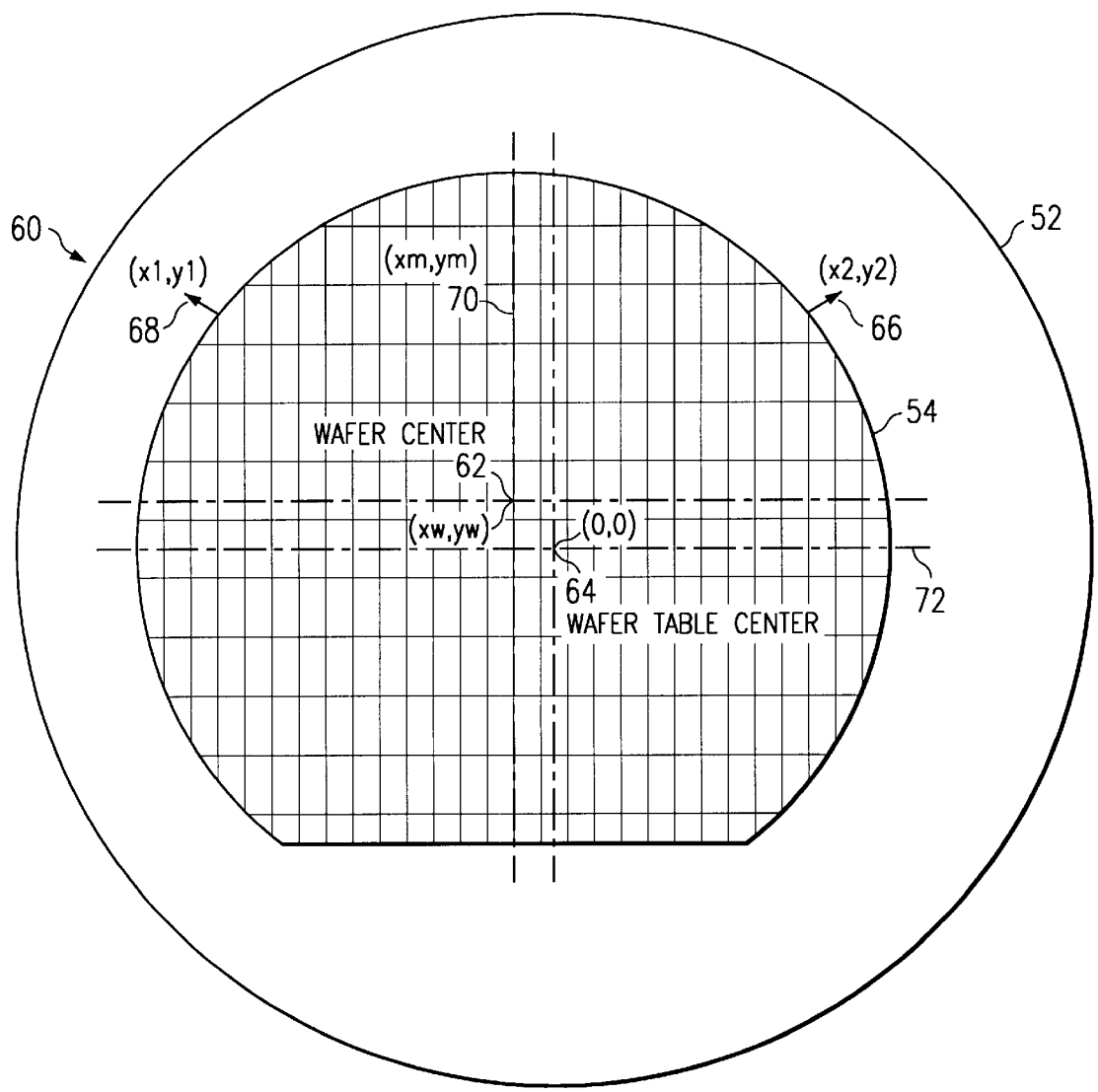
FIG. 2 is a diagram showing the position of the silicon wafer on the wafer table.

FIG. 2 is a diagram 60 showing an exemplary position of silicon wafer 54 on adhesive surface 52 of wafer table 50. Wafer center 62 (Xw,Yw) is located at a different position than wafer table center 64 (0,0). The analog or digital data generated by video camera 22 is transmitted to wafer center computing system 38 of FIG. 1, which processes the data to determine the coordinates of predetermined edge points within a Cartesian coordinate system 72 of wafer table 50 of FIG. 1. These predetermined edge points comprise a right edge point coordinate 66 (X2,Y2) and a left edge point coordinate 68 (X1,Y1).

Right edge point coordinate 66 and left edge point coordinate 68 are used to determine the coordinates of a midpoint 70 (Xm,Ym). The coordinates of midpoint 70 may then be used with the known value of the radius of silicon wafer 54 stored on data storage system 26 to compute the coordinates of wafer center 62 in Cartesian coordinate system 72.

For example, the coordinates of wafer center 62 in Cartesian coordinate system 72 of wafer table 50 may be computed from right edge point coordinate 66, left edge point coordinate 68, and wafer table center 64 by the following equations:

R=radius of silicon wafer 54
Xm=(X1+X2)/2
Ym=(Y1+Y2)/2
D=SQRT((X1−Xm)*(X1−Xm)+((Y1−Ym)*(Y1−Ym))
C=SQRT ((R*R)−(D*D))
Xw=Xm
Yw=Ym+C if Ym is negative
　　=Ym−C if Ym is positive Thus, using the equations shown above, it is possible to compute the coordinates of wafer center 62 in Cartesian coordinate system 72.

One of ordinary skill in the art will recognize that various changes, substitutions, and alterations can be made to diagram 60 and the method used to determine wafer center 62 without departing from the teachings of the present invention. For example, other predetermined points than right edge point coordinate 66 and left edge point coordinate 68 may be used to compute the coordinates of wafer center 62. Furthermore, other mathematical operations may be used to compute the coordinates of wafer center 62 than those described above.

Figure 3:
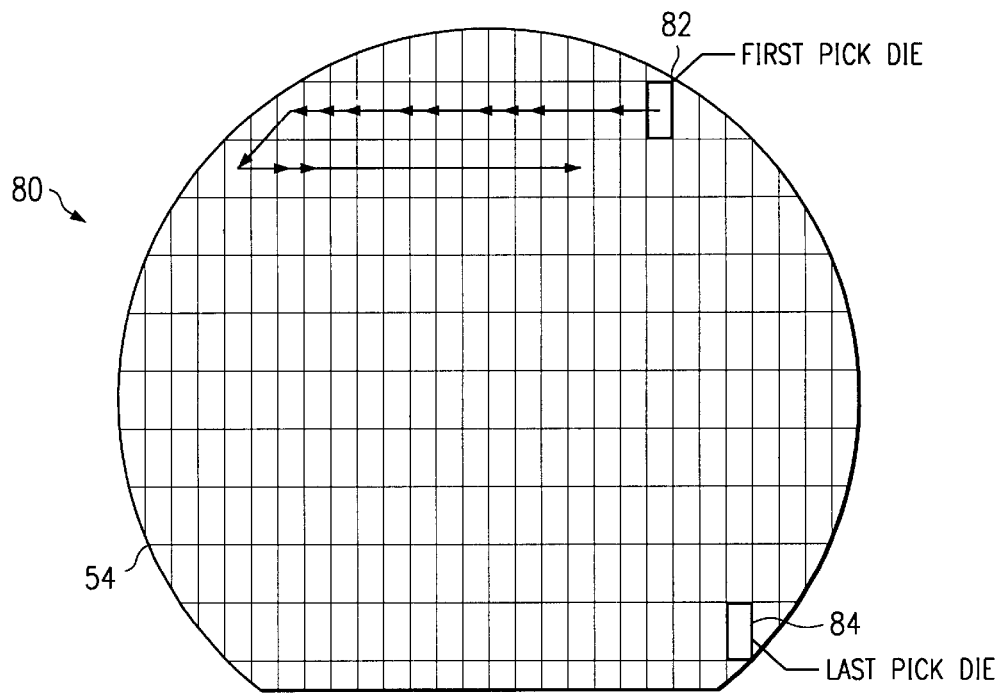
FIG. 3 is a diagram showing the sequence in which cut dies are removed from the wafer table in accordance with the teachings of the present invention.

FIG. 3 is a diagram 80 showing the sequence in which cut dies are removed from wafer table 50 of FIG. 1 in accordance with teachings of the present invention. As shown in FIG. 3, silicon wafer 54 is divided and cut into rectangular dies. Suction device 44 of robot arm 40 of FIG. 1 is used to remove the dies one at a time from adhesive surface 52 of wafer table 5Q, starting with first pick die 82 and ending with last pick die 84 of FIG. 3. The point at which suction device 44 removes the dies is the die retrieval position. Wafer table 50 moves silicon wafer 54 such that each die is moved to the die retrieval position. Any non-rectangular dies are left on adhesive surface 52, in addition to any rectangular dies that are not removed by suction device 44 of robot arm 40 because of positioning errors.

After the coordinates of wafer center 62 have been transmitted to wafer table 50 of wafer table system 14, wafer table 50 computes the edge coordinates of silicon wafer 54 within Cartesian coordinate system 72. Wafer table 50 then moves silicon wafer 54 in the negative "X" direction shown in FIG. 2 such that die removal may proceed in the direction shown by the arrows in FIG. 3. If movement of wafer table 50 would cause suction device 44 and the die retrieval position to be placed outside of the computed edge coordinates of silicon wafer 54, then wafer table 50 changes the direction of movement in the negative, "Y" direction shown in FIG. 2. Thus, die removal continues in the next row adjacent to the row of first pick die 82, as shown by the arrow in FIG. 3. Die removal proceeds in this manner until last pick die 84 has been removed.

Alternately, wafer table 50 or robot controller 42 may have stored in memory a map of a silicon wafer from which dies have been cut, such that the predetermined coordinates of each die that has been cut may be determined by shifting the coordinates of each die in the memory map. Likewise, the predetermined coordinates of a first pick die may be used to locate each other die, based upon a predetermined relationship between each other die and the first pick die.

The present invention overcomes problems associated with known ways of controlling die removal from wafer table 50 that do not provide wafer table 50 with the coordinates of wafer center 62. These known ways of controlling die removal use an assumed position of wafer center 54, and may result in discarding usable rectangular dies from silicon wafer 54.

Figure 4:
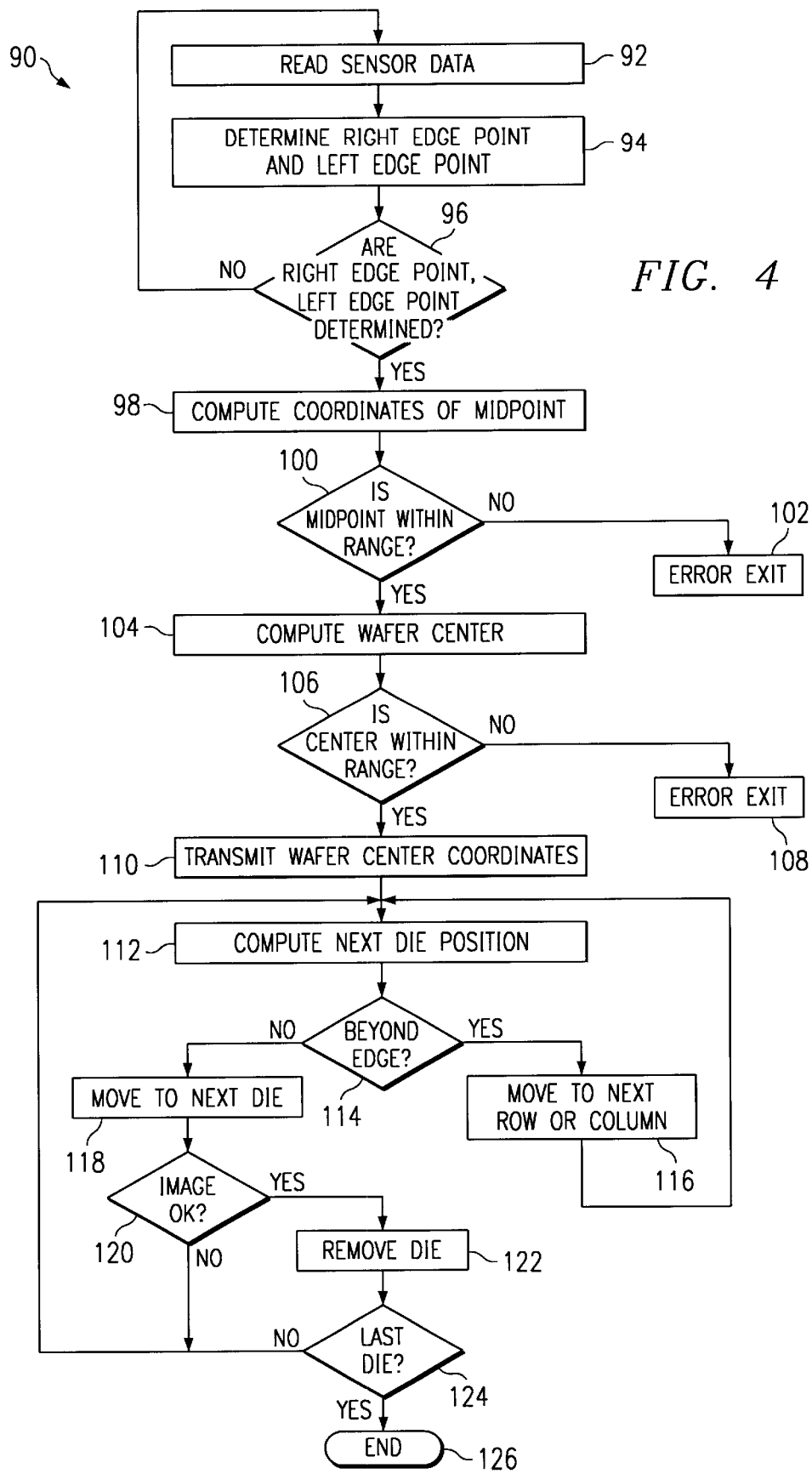
FIG. 4 is a flow chart of a method for locating the center of a silicon wafer and for removing dies cut from the silicon wafer.

FIG. 4 is an exemplary flow chart 90 of a method for determining the coordinates of wafer center 62, such as would be implemented by wafer center computing system 38 of FIG. 1, and for controlling the movement of wafer table 50. The method of flow chart 90 begins at step 92, where sensor data generated by video camera 22 is transmitted to wafer center computing system 38. This sensor data is subsequently used to determine the coordinates of predetermined points within Cartesian coordinate system 72 of wafer table 50. For example, wafer center computing system 38 may contain processor operating commands that include a pattern recognition program. This pattern recognition program receives the analog and digital data generated by video camera 22 and generates an image of silicon wafer 54 that is imposed on the known Cartesian coordinate system 72 of wafer table 50.

At step 94, the coordinates of right edge point coordinate 66 and left edge point coordinate 68 of silicon wafer 54 in Cartesian coordinate system 72 of FIG. 2 are determined by wafer center computing system 38. At step 96, it is determined whether right edge point coordinate 66 and left edge point coordinate 68 have been properly detected. For example, the values of right edge point coordinate 66 and left edge point coordinate 68 may be compared With the minimum and maximum values allowed within Cartesian coordinate system 72. If the values of right edge point coordinate 66 and left edge point coordinate 68 exceed the minimum and maximum values allowed, such as because of an error in the pattern recognition program, the method returns to step 92, where sensor data is read again. Otherwise, the method proceeds to step 98.

At step 98, the coordinates of midpoint 70 are computed. For example, midpoint 70 may be determined by averaging the "X" coordinate values of right edge point coordinate 66 and left edge point coordinate 68, and averaging the "Y" coordinates of right edge point coordinate 66 and left edge point coordinate 68. The method then proceeds to step 100.

At step 100, it is determined whether an allowable midpoint 70 has been computed. For example, if the coordinates computed for midpoint 70 exceed the range of allowable midpoints for silicon wafer 54 placed on wafer table 50, then the method proceeds to step 102, and exits on an error signal. Otherwise, the method proceeds to step 104.

At step 104, wafer center 62 is computed. For example, wafer center 62 may be computed using the mathematical algorithms previously provided in the description of FIG. 3. The method then proceeds to step 106, where it is determined whether an allowable wafer center 62 has been computed. For example, if the coordinates computed for wafer center 62 exceed the range of allowable coordinates of wafer center 62 for silicon wafer 54 placed on wafer table 50, the method proceeds to step 108 and exits on an error message. Otherwise, the method proceeds to step 110.

At step 110, the coordinates of wafer center 62 are transmitted from wafer center computing system 38 to wafer table 50, which computes the coordinates of the wafer edge in Cartesian coordinate system 72 of FIG. 2. At step 112, wafer table 50 computes the coordinates of the next die to be removed. For the first die removed, these coordinates may be the predetermined coordinates for first pick die 82. For subsequent dies, these coordinates may be determined by adding or subtracting the "X" dimension of one die from the X-axis coordinates of the previously-removed die, depending upon the direction in which die removal is progressing. At step 114, the calculated coordinates of the die are compared with the edge coordinates for silicon wafer 54. If the calculated coordinates are beyond the edge of silicon wafer 54, the method proceeds to step 116 where wafer table 50 moves silicon wafer 54 to the next row or column. Otherwise, the method proceeds to step 118.

At step 118, wafer table 50 moves silicon wafer 54 to the position of the next die to be removed. The image of this die is checked at step 120 to verify that a good die is present. As previously described, this step may be accomplished with image recognition software operating on video interface system 30. If the image indicates that an acceptable die is present, the method proceeds to step 122, where die removal is performed. Otherwise, the method returns to step 112.

After die removal has been completed at step 122, the method proceeds to step 124, where it is determined whether the last die has been removed. If the last die has been removed, the method terminates at step 126. Otherwise, the method returns to step 112.

In operation, silicon wafer 54 is cut into dies and placed on wafer table 50. Silicon wafer 54 moves with respect to adhesive surface 52 during the die cutting process. This movement makes it necessary to determine the new location of silicon wafer 54 before the cut dies may be automatically removed in accordance with the present invention. Wafer center computing system 38 receives data from video camera 22 and determines the coordinates of wafer center 62 in Cartesian coordinate system 72 of wafer table 50.

The coordinates of wafer center 62 are then transmitted to wafer table 50, which uses the coordinates of wafer center 62 to compute the continuous edge coordinates of silicon wafer 54. Wafer table 50 then moves the cut dies to a location where robot arm 40 and suction device 44 may remove the cut dies, starting with first pick die 82 and ending with last pick die 84. As die removal progresses, wafer table 50 changes the location of silicon wafer and the direction of removal whenever the die removal position passes outside of the boundary of silicon wafer 54.

The present invention provides many important technical advantages. One important technical advantage of the present invention is that the center of a silicon wafer on a wafer table may be precisely located. Another important technical advantage of the present invention is that die removal methods may be implemented that minimize the number of usable cut dies that may be lost during the die removal process.

Although the present invention has been described in detail, it should be understood that various changes, substitutions, and alterations can be made hereto without departing from the spirit and the scope of the invention as defined by the appended claims.

What is claimed is:

1. A method for determining the center of a semiconductor wafer on a wafer table relative to a predetermined fixed location on said wafer table for accurate positioning and control of a robot arm, the method comprising the steps of:

providing a wafer table movable in an x-y plane of a Cartesian coordinate system and having a semiconductor wafer disposed thereon;

providing a sensing device for measuring geometrical data of said semiconductor wafer disposed on said wafer table;

measuring geometrical data of said wafer disposed on said wafer table with said sensing device in the Cartesian coordinate system of said wafer table;

providing a wafer center computing system containing data relative to said predetermined fixed location on said wafer table;

receiving the measured geometrical data of said wafer at said wafer center computing system;

computing in the Cartesian coordinate system of said wafer table the coordinates of said wafer center from said predetermined fixed location and said measured geometrical data of said wafer and the offset between a predetermined location on said wafer and said predetermined fixed location on said wafer table; and controlling a robot arm in response to said offset.

2. The method of claim 1 wherein said step of computing in the Cartesian coordinate system comprises computing an X-axis coordinate (Xw) and a Y-axis coordinate (Yw) of the center of the wafer in the wafer table Cartesian coordinate system;

computing coordinates of an edge of the silicon wafer from the wafer center coordinates (Xw,Yw);

determining the offset between the center of said wafer and said predetermined location on said wafer table; and controlling said robot arm in response to said offset.

3. The method of claim 2, wherein the step of computing the X-axis coordinate and the Y-axis coordinate comprises the steps of:

determining two edge point coordinates (X1,Y1) and (X2,Y2) of the silicon wafer; and computing the wafer center coordinates using the two edge point coordinates.

4. The method of claim 3 wherein the step of determining comprises the steps of:

receiving data from a video camera;

processing the data with an image recognition program to generate an image of the wafer;

imposing the image on a known coordinate system; and determining two edge points coordinates (X1,Y1) and (X2,Y2) of the silicon wafer from the image imposed on the known coordinate system.

5. The method of claim 1 further comprising the step of removing dies with said robot arm.

6. A method for determining the center of a semiconductor wafer on a wafer table relative to a predetermined fixed location on said wafer table for accurate positioning and control of a robot arm, the method comprising the steps of:

providing a wafer table movable in an x-y plane of a Cartesian coordinate system and having a semiconductor wafer disposed thereon;

providing a sensing device for measuring geometrical data of said semiconductor wafer disposed on said wafer table;

measuring geometrical data of said wafer disposed on said wafer table with said sensing device in the Cartesian coordinate system of said wafer table;

providing a wafer center computing system containing data relative to said predetermined fixed location on said wafer table;

receiving the measured geometrical data of said wafer at said wafer center computing system;

computing in the Cartesian coordinate system of said wafer table the coordinates of said wafer center from said predetermined fixed location and said measured geometrical data of said wafer and the offset between a predetermined location on said wafer and said predetermined fixed location on said wafer table;

controlling a robot arm in response to said offset; and removing dies with said robot arm;

wherein the step of removing dies with a robot assembly further comprises the steps of:

moving the wafer to place one of a plurality of dies at a die removal position;

verifying the presence of an acceptable die at the die removal position with a die sensor;

moving the wafer by a predetermined amount if an acceptable die is not at the die removal position; and moving the wafer to a predetermined position if the die removal position is beyond the edge of the wafer.

7. A method for determining the center of a semiconductor wafer (Xw, Yw) on and relative to a predetermined location on a wafer table for control of a robot arm, the method comprising the steps of:

providing said wafer table having a wafer table center with coordinates and having a coordinate system associated therewith with said semiconductor wafer thereon;

receiving data indicative of an image of said semiconductor wafer from a video camera;

processing the data with an image recognition program to generate an image of the semiconductor wafer;

imposing the image on said coordinate system;

determining two edge point coordinates (X1, Y1) and (X2, Y2) of the semiconductor wafer in said coordinate system;

computing a value of an X-axis coordinate (Xm) of a midpoint of a line bisecting the semiconductor wafer equal to (X1+X2)/2 in said coordinate system;

computing a value of a Y-axis coordinate (Ym) of the midpoint of the line bisecting the semiconductor wafer equal to (Y1+Y2)/2 in said coordinate system;

computing a first distance (D) between the midpoint having coordinates (Xm, Ym) and one of the first edge point and the second edge point in said coordinate system;

computing a second distance (c) between said midpoint and said wafer table center;

computing in said coordinate system coordinates of an edge of the semiconductor wafer from a wafer center coordinates (Xw, Yw);

moving the silicon wafer to place one of a plurality of dies at a die removal position responsive to a calculation of the distance between said midpoint and said predetermined location;

verifying the presence of an acceptable die at the die removal position with a die sensor;

moving the semiconductor wafer by a predetermined amount if an acceptable die is not at the die removal position;

moving the silicon wafer to a predetermined position if the die removal position is beyond the edge of the semiconductor wafer; and controlling a robot arm to remove said acceptable die.

8. The method of claim 7 wherein the step of computing the first distance (D) comprises the step of finding the square root of $((X1-Xm)*(X1-Xm)+(Y1-Ym)*(Y1-Ym))$.

9. The method of claim 7 wherein the step of computing the second distance (C) comprises the step of finding the square root of $((R*R)-(D*D))$, where R equals a radius of the silicon wafer.

10. The method of claim 7 wherein the step of computing the coordinates of the wafer center comprises the steps of:

equating the wafer center X-axis coordinate (Xw) to Xm;

equating the wafer center Y-axis coordinate (Yw) to (Ym+C) if Ym is negative; and equating Yw to (Ym−C) if Ym is positive.

* * * * *